(12) United States Patent
Lee

(10) Patent No.: US 9,059,066 B2
(45) Date of Patent: Jun. 16, 2015

(54) METHOD OF MANUFACTURING CMOS IMAGE SENSOR

(71) Applicant: SAMSUNG ELECTRONICS CO., LTD., Suwon-si, Gyeonggi-do (KR)

(72) Inventor: Yun-Ki Lee, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/228,914

(22) Filed: Mar. 28, 2014

(65) Prior Publication Data

US 2014/0213011 A1 Jul. 31, 2014

Related U.S. Application Data

(62) Division of application No. 12/940,410, filed on Nov. 5, 2010, now Pat. No. 8,686,482.

(30) Foreign Application Priority Data

Nov. 5, 2009 (KR) .................. 10-2009-0106263

(51) Int. Cl.
*H01L 31/113* (2006.01)
*H01L 27/146* (2006.01)

(52) U.S. Cl.
CPC ..... *H01L 27/14685* (2013.01); *H01L 27/14621* (2013.01); *H01L 27/14623* (2013.01); *H01L 27/14627* (2013.01); *H01L 27/1463* (2013.01);
(Continued)

(58) Field of Classification Search
CPC .................................................... H01L 31/113
USPC .................. 257/292, 219, 225, 239, E31.085
See application file for complete search history.

(56) References Cited

U.S. PATENT DOCUMENTS

| 7,875,840 B2 | 1/2011 | Jiang et al. |
| 2006/0118698 A1* | 6/2006 | Yu .............................. 250/208.1 |
| 2008/0117319 A1 | 5/2008 | Jiang et al. |

(Continued)

FOREIGN PATENT DOCUMENTS

| CN | 101064326 A | 10/2007 |
| CN | 101192571 A | 6/2008 |

(Continued)

OTHER PUBLICATIONS

Chinese Office action dated Jun. 4, 2014 for co-pending CN 201010539761.6, Yun ki Lee.

*Primary Examiner* — Marc Armand
(74) *Attorney, Agent, or Firm* — Lee & Morse, P.C.

(57) ABSTRACT

A CIS and a method of manufacturing the same, the CIS including a substrate having a first surface and second surface opposite thereto, the substrate including an APS array region including a photoelectric transformation element and a peripheral circuit region; an insulating interlayer on the first surface of the substrate and including metal wirings electrically connected to the photoelectric transformation element; a light blocking layer on the peripheral circuit region of the second surface of the substrate, exposing the APS array region, and including a plurality of metal wiring patterns spaced apart from one another to form at least one drainage path along a boundary region between the APS array region and the peripheral circuit region; a color filter layer on the second surface of the substrate covering the APS array region and the light blocking layer; and a microlens on the color filter layer on the APS array region.

10 Claims, 11 Drawing Sheets

(52) U.S. Cl.
CPC ..... *H01L 27/14636* (2013.01); *H01L 27/14643* (2013.01); *H01L 27/1464* (2013.01)

(56) References Cited

U.S. PATENT DOCUMENTS

2008/0131991 A1 6/2008 Kim
2009/0065821 A1 3/2009 Lee
2011/0108715 A1 5/2011 Chen et al.

FOREIGN PATENT DOCUMENTS

| JP | 2003-086826 A | 3/2003 |
| JP | 2008-270381 A | 11/2008 |
| KR | 10 2004-0008927 A | 1/2004 |

* cited by examiner

METHOD OF MANUFACTURING CMOS IMAGE SENSOR

CROSS REFERENCE TO RELATED APPLICATION

This is a divisional application based on pending application Ser. No. 12/940,410, filed Nov. 5, 2010, the entire contents of which is hereby incorporated by reference.

BACKGROUND

1. Field

Embodiments relate to a complementary metal-oxide semiconductor (CMOS) image sensor (CIS) and a method of manufacturing the CIS.

2. Description of the Related Art

Generally, a complementary metal-oxide semiconductor image sensor (CIS) may include an active pixel sensor (APS) array region and a peripheral circuit (OBP, optical black pixel) region. In the APS array region, a transfer transistor may be formed between a photodiode and a floating diffusion layer.

In the APS array region, which may function as a light receiving region, optical energy may be transmitted to the photodiode and the floating diffusion layer. In the OBP region, a light blocking layer may be formed to block light on the OBP region. A color filter layer may be formed on the APS array region and the OBP region to cover the light blocking layer.

SUMMARY

Embodiments are directed to a complementary metal-oxide semiconductor (CMOS) image sensor (CIS) and a method of manufacturing the CIS.

At least one of the above and other features and advantages may be realized by providing a complementary metal-oxide semiconductor (CMOS) image sensor (CIS) including a substrate having a first surface and a second surface opposite to the first surface, the substrate including an active pixel sensor (APS) array region, the APS array region including a photoelectric transformation element, and a peripheral circuit region; an insulating interlayer on the first surface of the substrate, the insulating interlayer including metal wirings electrically connected to the photoelectric transformation element; a light blocking layer on the peripheral circuit region of the second surface of the substrate, the light blocking layer exposing the APS array region and including a plurality of metal wiring patterns spaced apart from one another to form at least one drainage path along a boundary region between the APS array region and the peripheral circuit region; a color filter layer on the second surface of the substrate, the color filter layer covering the APS array region and the light blocking layer; and a microlens on the color filter layer on the APS array region.

The drainage path of the light blocking layer may be at a corner portion of the light blocking layer.

The drainage path of the light blocking layer may be at a middle portion of the light blocking layer.

The metal wiring patterns may form a plurality of drainage paths, the drainage paths being at a corner portion and a middle portion of the light blocking layer.

The light blocking layer may include aluminum.

The color filter layer may have a uniform height along the boundary region between the APS array region and the peripheral circuit region.

The color filter layer may have a uniform, flat surface across the APS array region, the peripheral circuit region, and the boundary region therebetween.

The metal wiring patterns may surround the APS array region.

At least one of the above and other features and advantages may also be realized by providing a method of manufacturing a complementary metal-oxide semiconductor (CMOS) image sensor (CIS), the method including preparing a substrate having a first surface and a second surface opposite to the first surface such that the substrate includes an active pixel sensor (APS) array region including a photoelectric transformation element, and a peripheral circuit region; forming an insulating interlayer on the first surface of the substrate such that the insulating interlayer includes metal wirings electrically connected to the photoelectric transformation element; forming a light blocking layer on the peripheral circuit region of the second surface of the substrate such that the light blocking layer exposes the APS array region and includes a plurality of metal wiring patterns spaced apart from one another to form at least one drainage path along a boundary region between the APS array region and the peripheral circuit region; forming a color filter layer on the second surface of the substrate to cover the APS array region and the light blocking layer; and forming a microlens on the color filter layer on the APS array region.

Forming the light blocking layer may include forming a metal wiring layer on the second surface of the substrate such that the metal wiring layer surrounds the APS array region; and partially removing the metal wiring layer to form the metal wiring patterns defining the at least one drainage path.

The drainage path may be formed at a corner portion of the metal wiring layer.

The drainage path may be formed at a middle portion of the metal wiring layer.

The metal wiring patterns may form a plurality of drainage paths at a corner portion and a middle portion of the metal wiring layer.

The metal wiring layer may include aluminum.

Forming the APS array region and the peripheral circuit region may include forming an epitaxial layer in the first surface of the substrate; forming a photodiode, a transfer gate, and a floating diffusion layer on the epitaxial layer in a first region of the substrate; and forming a logic transistor in a second region of the substrate.

The method may further include removing portions of the second surface of the substrate to expose the epitaxial layer.

Forming the color filter layer may include coating a coating solution for a color filter layer on the second surface of the substrate; and draining a portion of the coating solution from the APS array region through the drainage path of the light blocking layer such that the color filter layer has a uniform height along the boundary region between the APS array region and the peripheral circuit region.

Forming the color filter layer may include coating a coating solution for a color filter layer on the second surface of the substrate; and draining a portion of the coating solution from the APS array region through the drainage path of the light blocking layer such that the color filter layer has a uniform, flat surface across the APS array region, the peripheral circuit region, and the boundary region therebetween.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
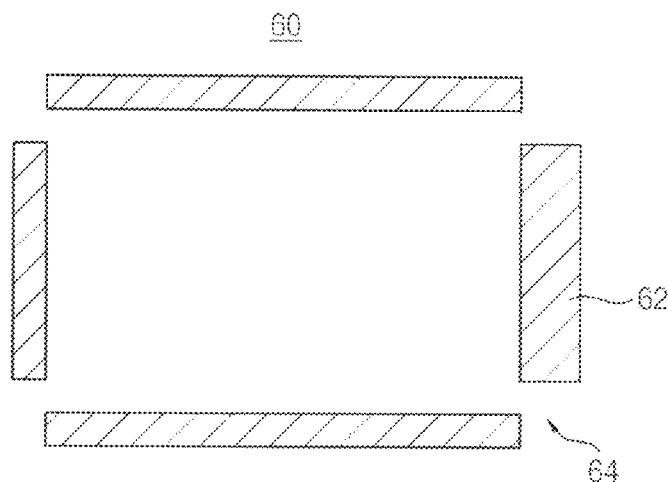
FIG. 1 illustrates a plan view of a light blocking layer having a drainage path in accordance with an embodiments.

Korean Patent Application No. 10-2009-0106263, filed on Nov. 5, 2009, in the Korean Intellectual Property Office, and entitled: "CMOS Image Sensor and Method of Manufacturing the CMOS Image Sensor," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a plan view of a light blocking layer having a drainage path in accordance with an embodiment.

Referring to FIG. 1, a light blocking layer 60 may be formed on a backside, e.g., a second surface, of a substrate. The substrate may include an active pixel sensor (APS) array region and a peripheral circuit (OBP, optical black pixel) region. A plurality of photoelectric transformation elements may be formed in the APS array region. For example, a photodiode, a transfer gate, and/or a floating diffusion layer may be formed in the APS array region. A peripheral logic metal-oxide semiconductor (MOS) transistor may be formed in the OBP region.

The light blocking layer 60 may be formed on the OBP region, e.g., exposing the APS array region. For example, the light blocking layer 60 may include aluminum. Accordingly, optical energy may be transmitted to the APS array region of a CIS having a backside illumination (BSI) architecture.

In an implementation, the light blocking layer 60 may have at least one drainage path 64 at each of four corner portions thereof. For example, the light blocking layer 60 may include four metal wiring patterns 62 on the OBP region. The metal wiring patterns 62 may be arranged to surround the APS array region. The metal wiring patterns 62 may be spaced apart from one another to form the drainage path 64.

A color filter layer may be provided on the backside, e.g., second surface, of the substrate. The color filter layer may be formed on the APS array region and the OBP region, e.g., may cover the light blocking layer 60.

Accordingly, in an embodiment, a portion of a coating solution for forming the color filter layer may be drained from the APS array region through the drainage path 64 of the light blocking layer 60, thereby forming the color filter layer having a uniform height along a boundary region between the APS array region and the OBP region. In other words, the color filter layer may have a uniform, flat surface across the APS array region, the OPB region, and the boundary region therebetween.

The drainage path 64 may be formed at the corner portion of the light blocking layer 60 where a relatively greater surface tension may occur. Additionally, the drainage path 64 may be arranged freely without affecting signal processing.

Figure 2:
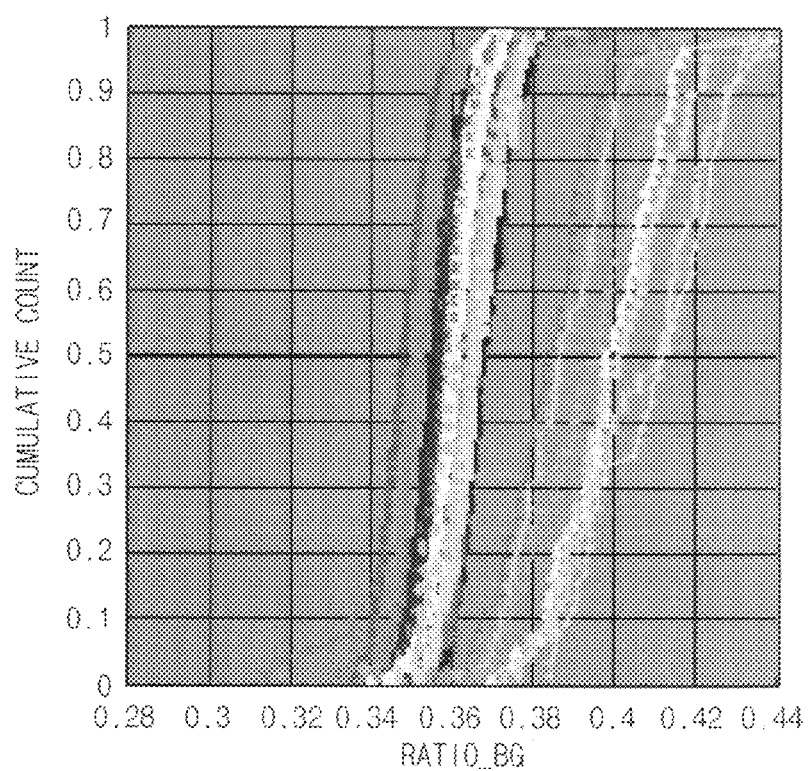
FIGS. 2 and 3 illustrate graphs showing color changes and distribution relations based on the presence and lack of a drainage path.
Figure 3:
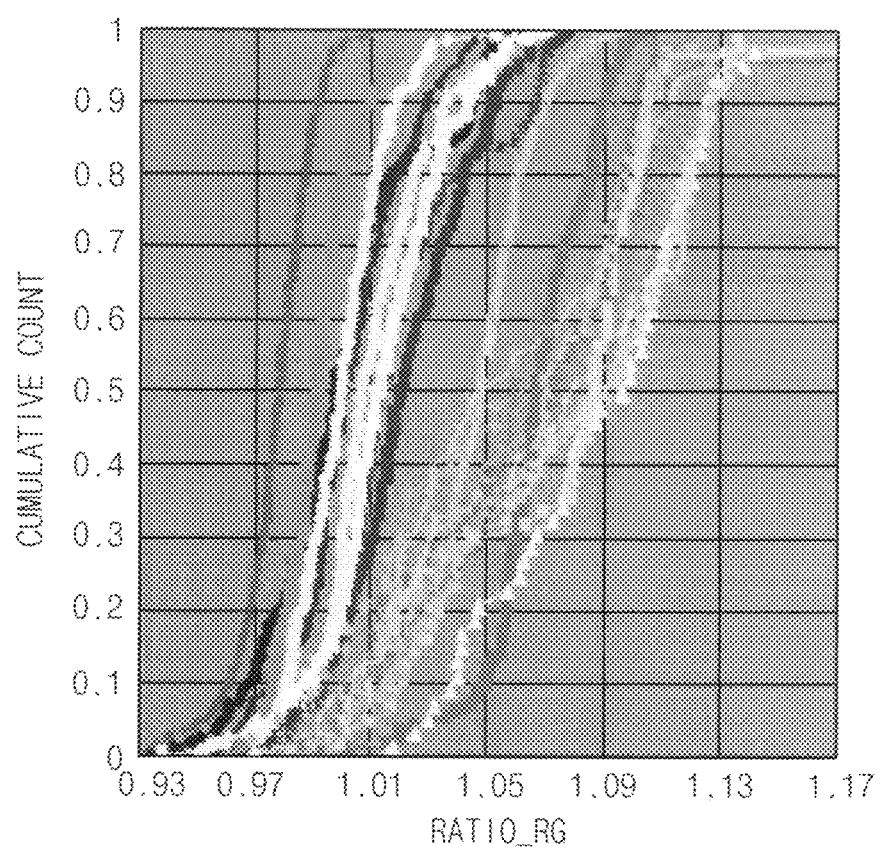

FIGS. 2 and 3 illustrate graphs showing color changes and distribution relations based on the existence and nonexistence of a drainage path.

Referring to FIG. 2, the left data of the graph show ratios and distributions of BG colors where the drainage path is present. The right data of the graph show ratios and distributions of BG colors where the drainage path is not present.

Comparing the left data and the right data, the left data indicate that resolution and electrical characteristics of the CIS were improved.

Referring to FIG. 3, the left data of the graph show ratios and distributions of RG colors when the drainage path is present. The right data of the graph show ratios and distributions of RG colors where the drainage path is not present.

Comparing the left data and the right data, the left data indicate that resolution and electrical characteristics of the CIS were improved. Additionally, in G color range, crosstalk effects of B and R colors were decreased.

Accordingly, the coating solution for forming the color filter layer may spread out uniformly due to the drainage path 64 of the light blocking layer 60, thereby improving characteristics of the CIS.

Figure 4:
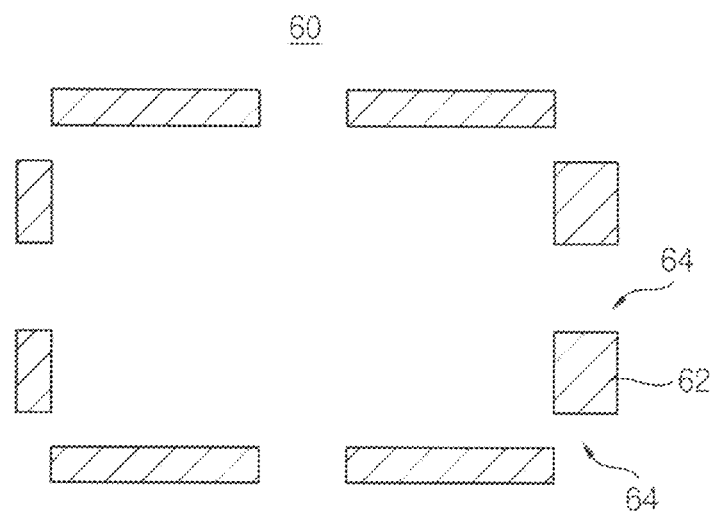
FIGS. 4 and 5 illustrate plan views of examples of a light blocking layer in accordance with an embodiment.
Figure 5:
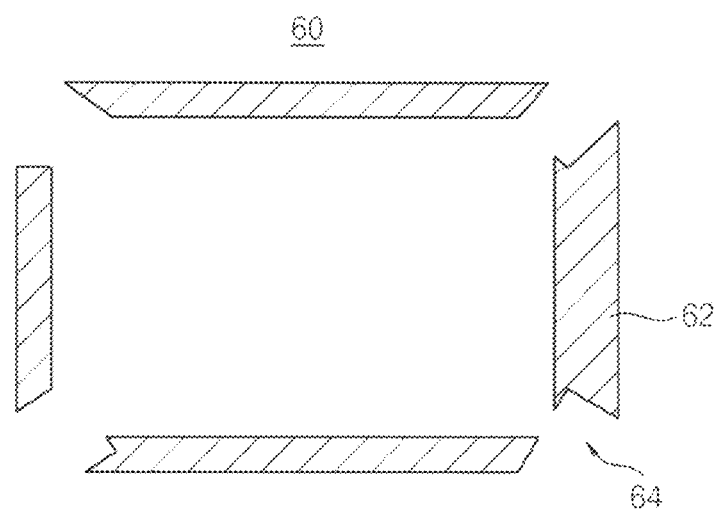

FIGS. 4 and 5 illustrate plan views of examples of a light blocking layer in accordance with an embodiment.

Referring to FIG. 4, the drainage paths 64 may be formed at the corner portions and middle portions of the light blocking layer 60.

Referring to FIG. 5, the drainage path 64 at the corner portion of the light blocking layer 60 may have a structure configured to prevent a vortex of the color filter coating solution.

The drainage paths 64 may be arranged symmetrically or asymmetrically. The drainage path 64 may have various shapes according to a circuit layout or a color filter coating solution.

Hereinafter, a method of manufacturing a CIS in accordance with an embodiment will be explained.

FIGS. 6 to 19 illustrate sectional views of stages in a method of manufacturing a CIS in accordance an embodiment.

Figure 6:
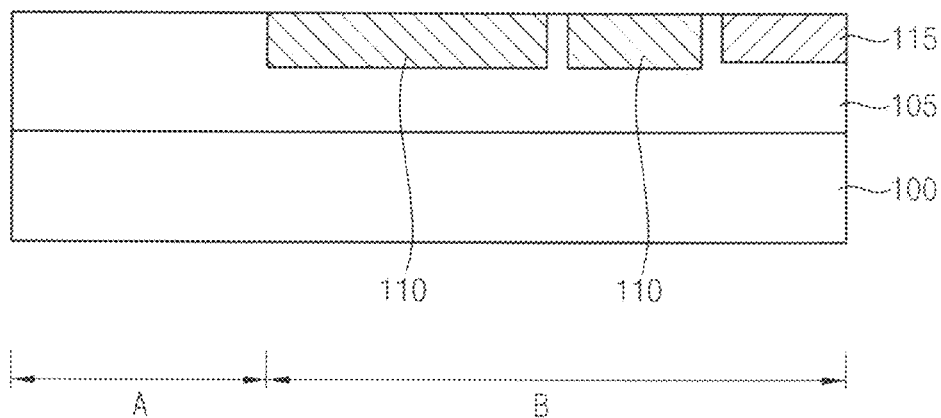
FIGS. 6 to 19 illustrate sectional views of stages in a method of manufacturing a CIS in accordance with an embodiment.

Referring to FIG. 6, a substrate 100 may include a first region A and a second region B. For example, the first region A may be provided for an active pixel sensor (APS) array region where a photodiode, a transfer gate, and a floating diffusion layer may be formed; and the second region B may be provided for a peripheral circuit (OBP, optical black pixel) region where a peripheral logic metal-oxide semiconductor (MOS) transistor may be formed.

The substrate 100 may include either a p-type substrate or an n-type substrate. The substrate 100 may have a first surface and a second surface opposite to the first surface.

An epitaxial layer 105 may be formed on the substrate 100. The epitaxial layer 105 may be formed in the first surface of the substrate 100. The epitaxial layer 105 may be lightly-doped with impurities. The epitaxial layer 105 may include first conductive type impurities. In an implementation, the epitaxial layer 105 may be formed to a thickness of about 5 µm to about 15 µm.

A first conductive type well 110 and second conductive type well 115 may be formed in an upper portion of the epitaxial layer 105 in the second region B.

Figure 7:
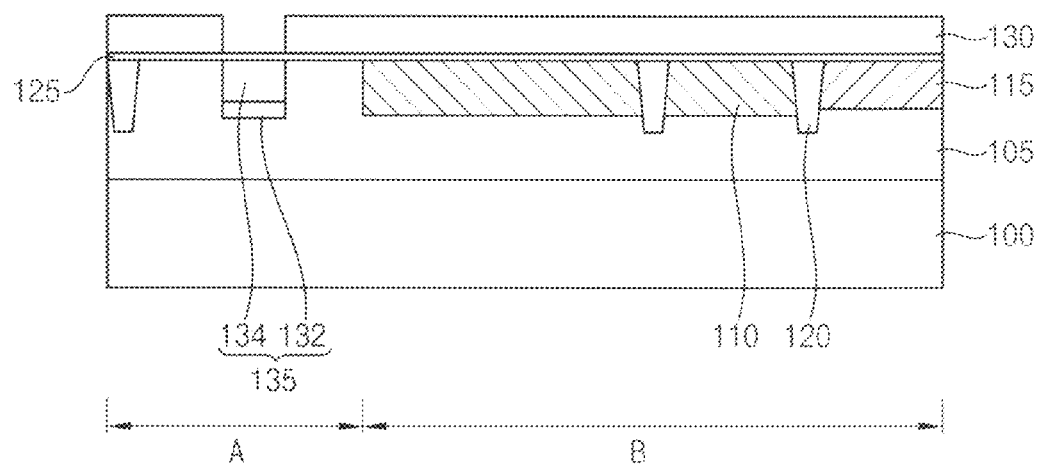

Referring to FIG. 7, an isolation layer 120 may be formed in the epitaxial layer 105. The isolation layer 120 may isolate photodiodes 145 (see FIG. 8) therebetween, or may isolate common devices and circuit elements therebetween. The isolation layer 120 may have different depths according to a location thereof. For example, the isolation layer 120 between the photodiodes 145 may have a depth deeper than that of the isolation layer 120 between the common devices and the circuit elements.

A pad oxide layer 125 may be formed on the epitaxial layer 105 and the isolation layer 120.

A first mask 130 may be formed on the pad oxide layer 125 to expose a portion of the first region A, e.g., a transfer transistor region. First conductive type impurities and second conductive type impurities may be sequentially implanted into the epitaxial layer 105 using the first mask 130 as an ion implantation mask to form a first channel region 132 and a second channel region 134 at upper portions of the epitaxial layer 105. The first and second channel regions 132 and 134 may be used for a transfer transistor. The first mask 130 may then be removed.

Figure 8:
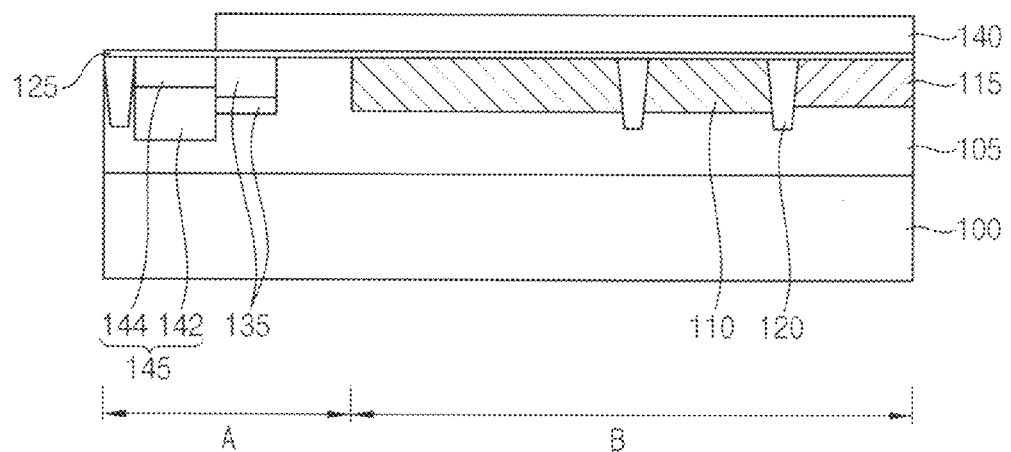

Referring to FIG. 8, the photodiode 145 may be formed at an upper portion of the epitaxial layer 105 in the first region A. For example, a second mask 140 may be formed on the pad oxide layer 125 to expose a photodiode region. Second conductive type impurities and first conductive type impurities may be sequentially implanted into the upper portion of the epitaxial layer 105 using the second mask 140 as an implantation mask. Thus, a first impurity region 142 and a second impurity region 144 may be respectively formed to thereby form the photodiode 145. In an implementation, the first impurity region 142 may have a depth of about 5 µm from a top surface of the epitaxial layer 105. The second mask 140 and the pad oxide layer 125 may then be removed.

Figure 9:
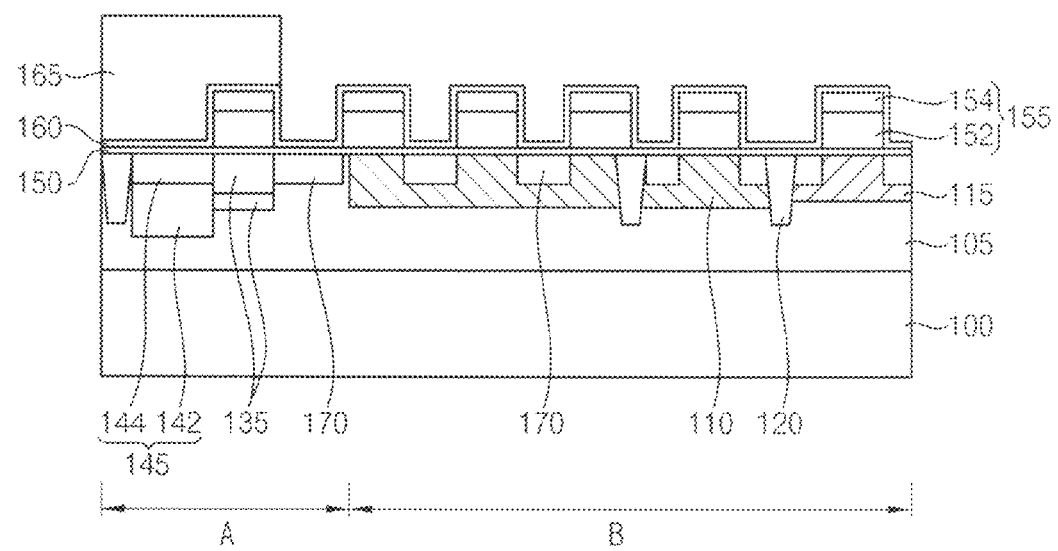

Referring to FIG. 9, a gate insulation layer 150 may be formed on the epitaxial layer 105 and the isolation layer 120. A plurality of gate structures 155 may be formed on the gate insulation layer 150 in the first and second regions A and B. Each of the gate structures 155 may include a gate electrode 152 and a hard mask 154.

In an implementation, a first blocking layer 160 may be formed on the gate structures 155 and the gate insulation layer 150. The first blocking layer 160 may be conformally formed on the gate structures 155 and the gate insulation layer 150. The first blocking layer 160 may be formed to a thickness of about 200 Å by, e.g., a chemical vapor deposition (CVD) process or an atomic layer deposition (ALD) process, using a nitride. The first blocking layer 160 may prevent or reduce undesired impurities (e.g., metal ions) from diffusing into the epitaxial layer 105 if an ion implantation process is subsequently performed.

A third mask 165 may be formed on the first blocking layer 160 in the first region A to cover the photodiode region and the transfer transistor region. Second conductive type impurities may be implanted into the epitaxial layer 105 by an implantation process using the third mask 165 and the gate structures 155 as an ion implantation mask to form a first lightly-doped impurity layer 170 at upper portions of the epitaxial layer 105 adjacent to the gate structures 155. The third mask 165 may then be removed.

In another implementation, the first blocking layer 160 may be formed after forming the first lightly-doped impurity layer 170 by an ion implantation process and after removing the third mask 165.

Figure 10:
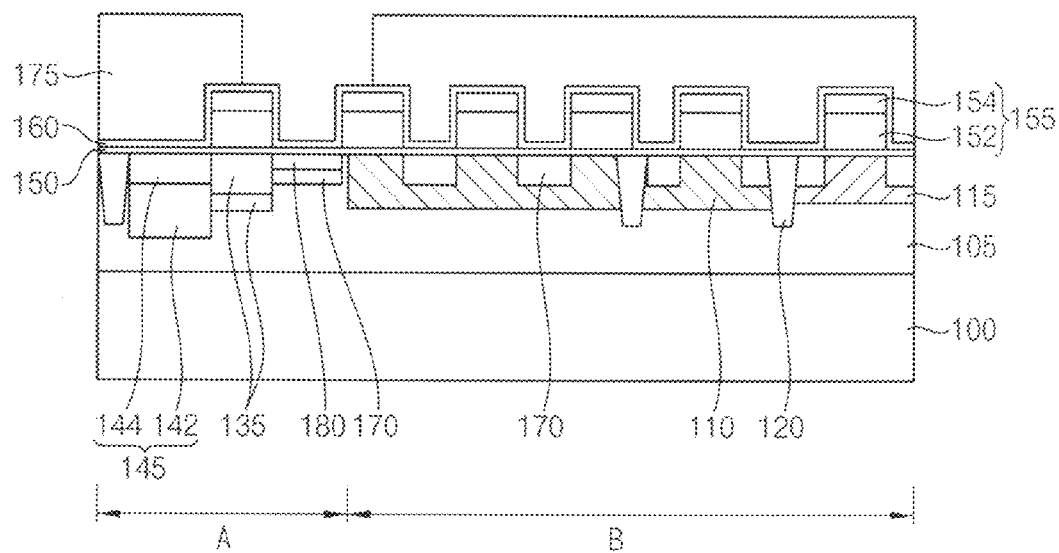
Figure 11:
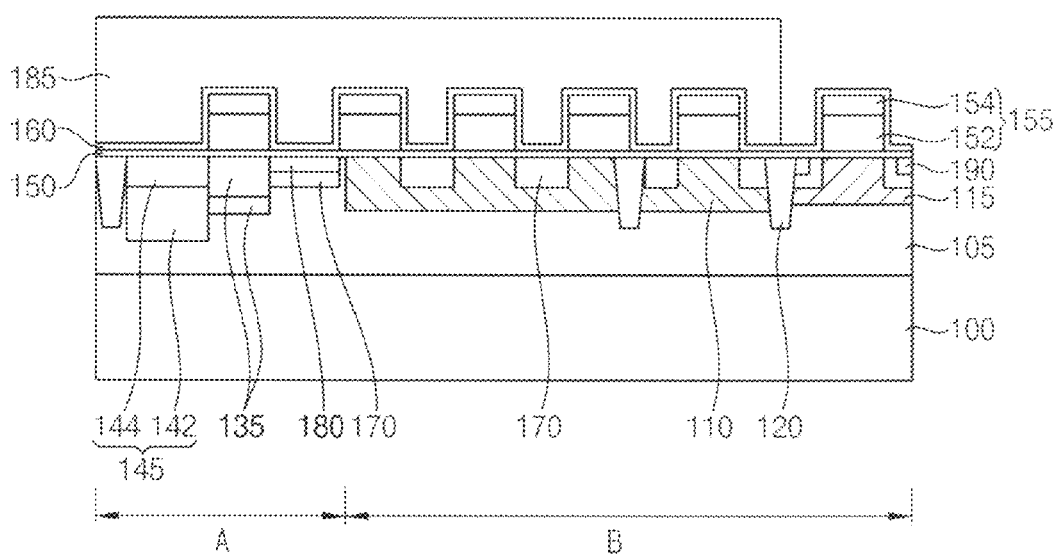

Referring to FIGS. 10 and 11, a fourth mask 175 may be formed on the first blocking layer 165 to expose a floating diffusion layer region. Second conductive type impurities may be implanted into the epitaxial layer 105 by an ion implantation process using the fourth mask 175 and the gate structures 155 as an ion implantation mask to form a first highly-doped impurity layer 180 at an upper portion of the first lightly-doped impurity layer 170. The first blocking layer 165 may prevent or reduce undesired impurities (e.g., metal ions) from diffusing into the epitaxial layer 105 when the first highly-doped impurity layer 180 is formed. The fourth mask 175 may then be removed.

Then, a fifth mask 185 may be formed on the first blocking layer 160 to expose a region for a PMOS to be formed in the region B. First conductive type impurities may be implanted into the epitaxial layer 105 by an ion implantation process using the fifth mask 185 and the gate structures 155 as an ion implantation mask to form a second lightly-doped impurity layer 190 at an upper portion of the first lightly-doped impurity layer 170. The fifth mask 185 may then be removed.

Figure 12:
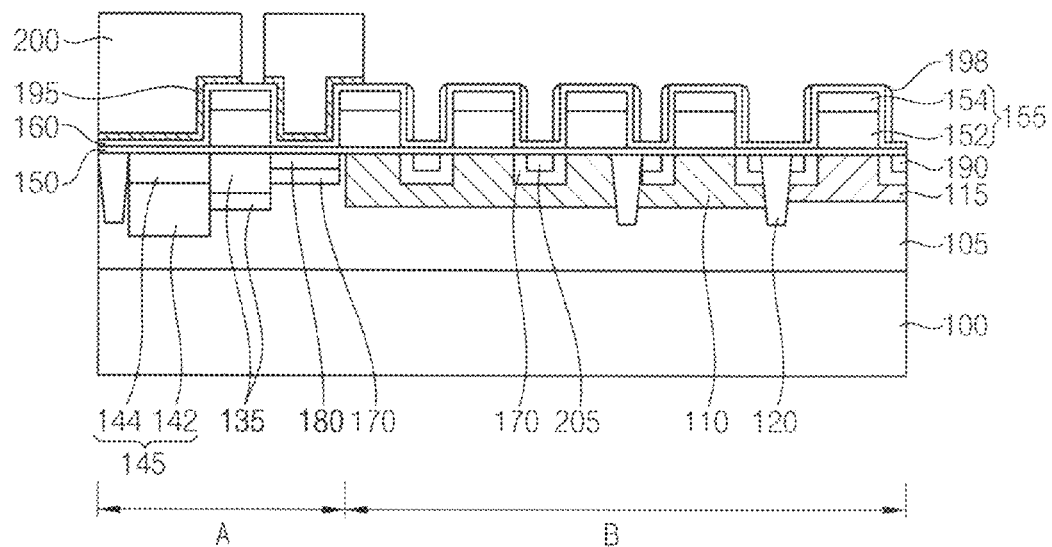

Referring to FIG. 12, a second blocking layer 195 may be formed on the first blocking layer 160 on the photodiode region and the floating diffusion layer region in the first region A. A spacer 198 may be formed on sidewalls of the gate structures 155 in the second region B. For example, a nitride layer (not shown) may be formed on the first blocking layer 160 to a thickness of about 500 Å by a CVD process. A sixth mask 200 may be formed on a portion of the nitride layer. The nitride layer may be partially removed by an etch back process to form the second blocking layer 195. Accordingly, the second blocking layer 195 may be formed on the first blocking layer 155 in the first region A. The spacer 198 may be formed on the sidewalls of the gate structures 150 in the second region B.

In an implementation, a portion of the first blocking layer 160 that is not covered by the sixth mask 200 may be not removed, thereby being used as an etch stop layer in a subsequent process.

In another implementation, the portion of the first blocking layer 160 that is not covered by the sixth mask 200 may also removed simultaneously with the nitride layer.

Then, a third highly-doped impurity layer 205 may be formed at an upper portion of the first lightly-doped impurity layer 170 in the second region B. For example, second conductive type impurities may be implanted into the epitaxial layer 105 to form the third highly-doped impurity layer 205 by an ion implantation process using the sixth mask 200 and a seventh mask (not shown) covering the second highly-doped impurity region 190.

Figure 13:
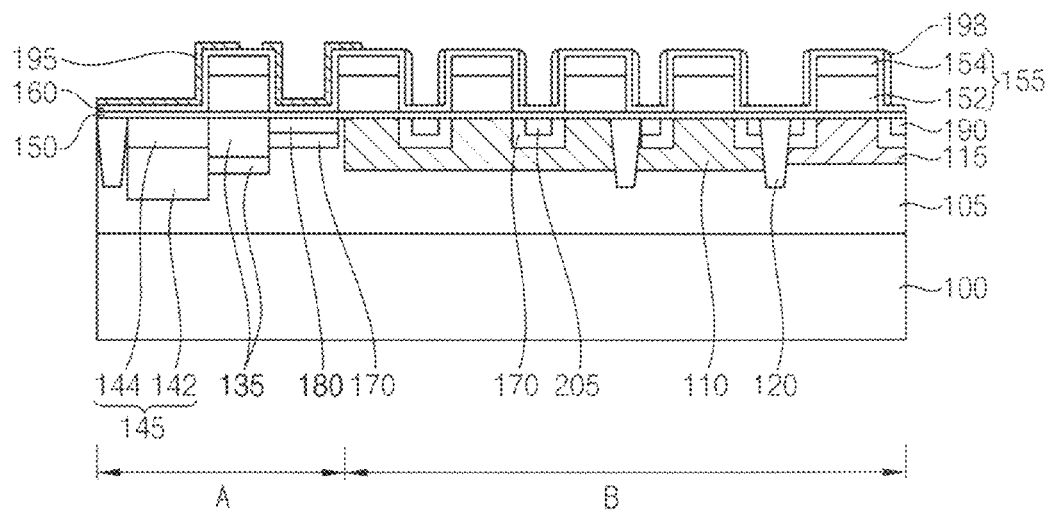

Referring to FIG. 13, after removing the sixth mask 200, a cleaning process may be performed. In an implementation, if the portion of the first blocking layer 160 that is not covered by the sixth mask 200 is already removed, an etch stop layer (not shown) may be formed using a nitride.

Figure 14:
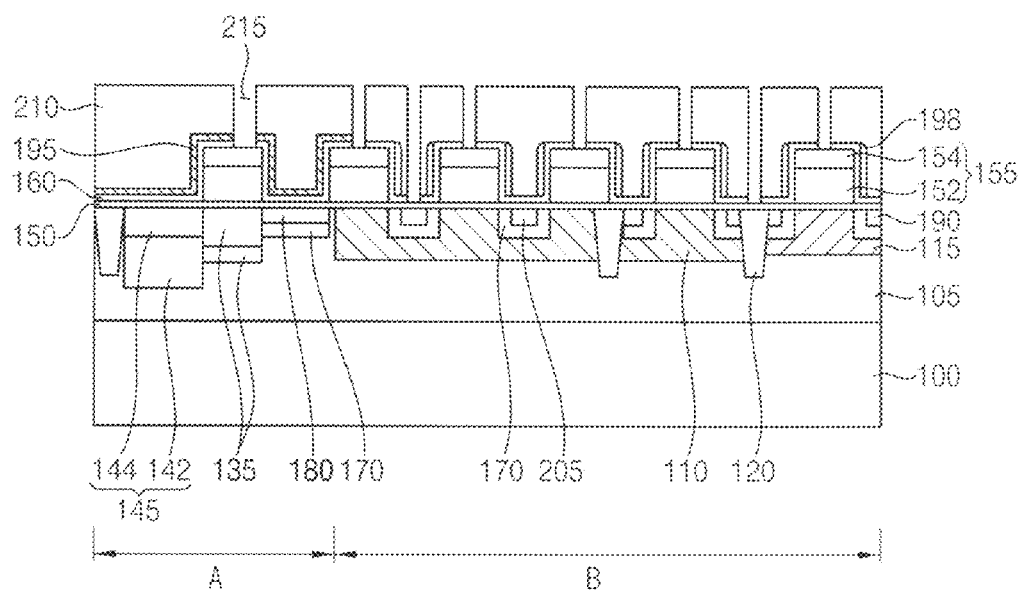
Figure 15:
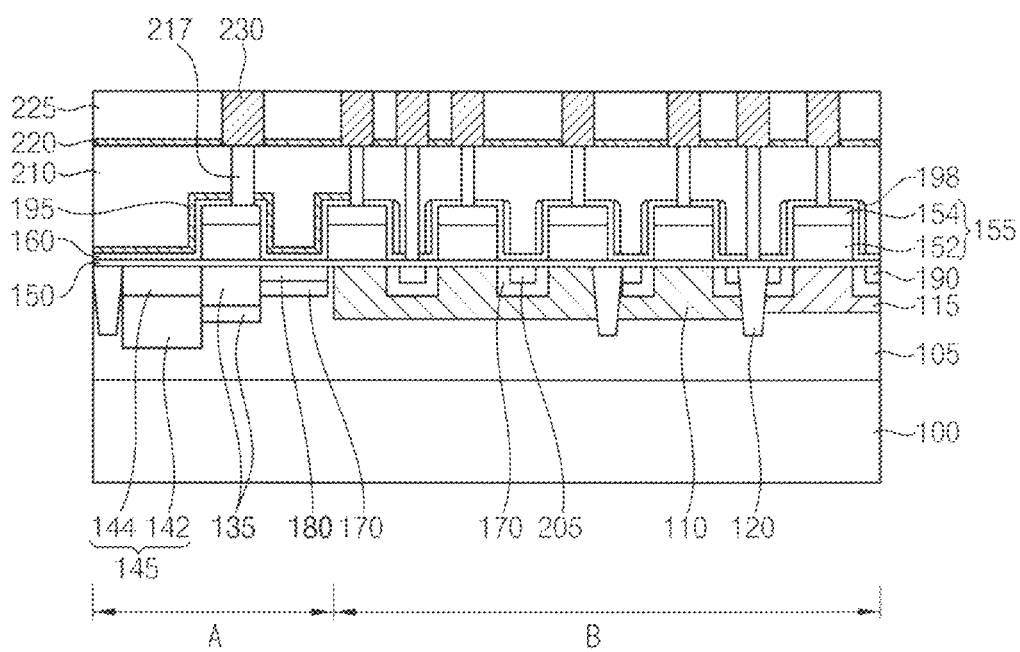
Figure 16:
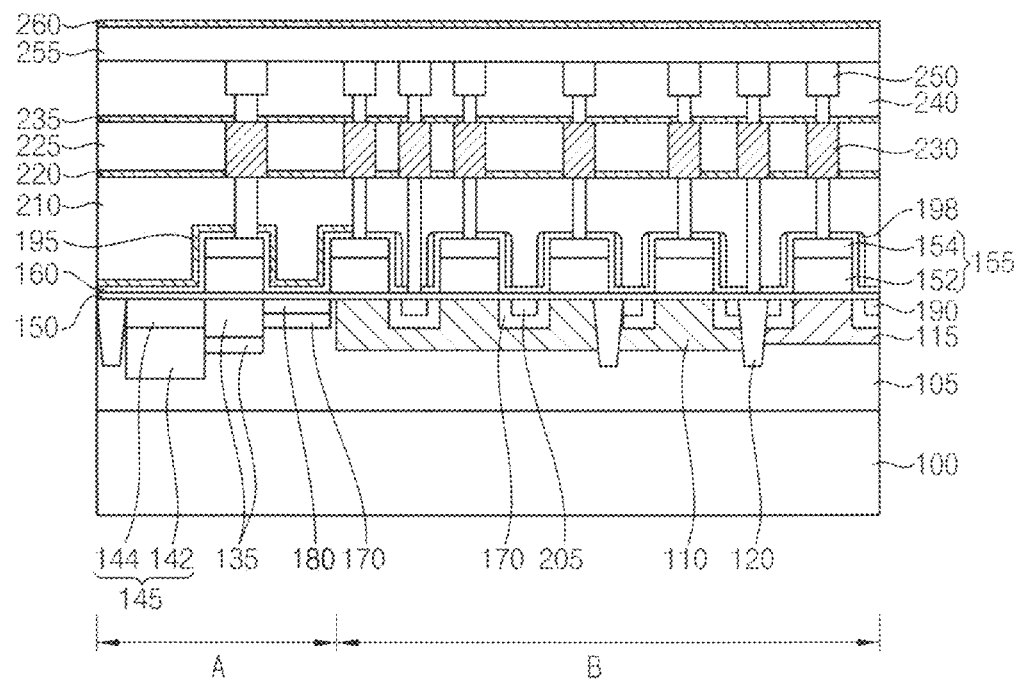

Referring to FIGS. 14 to 16, a first insulating interlayer 210 may be formed on the gate structures 155, the gate insulation layer 150, the first and second blocking layers 160 and 195, and the spacers 198. The first insulating interlayer 210 may be formed by, e.g., a CVD process, using an oxide (e.g., high density plasma (HDP) oxide). A plurality of contact holes 215 exposing portions of the gate structures 155, respectively, may be formed through the first insulating interlayer 210.

A plurality of first plugs 217 may be formed to fill the contact holes 215, respectively. The first plugs 217 may be formed using, e.g., a metal, a metal nitride, polysilicon, or the like.

A first etch stop layer 220 may be formed on the first insulating interlayer 210 and the first plugs 217. The first etch stop layer 220 may be formed using, e.g., a nitride. A second insulating interlayer 225 may be formed on the first etch stop layer 220. A first metal wiring 230 may be formed through the second insulating interlayer 225 to be electrically connected to the first plugs 217.

A second etch stop layer 235 may be formed on the second insulating interlayer 225 and the first metal wiring 215. A third insulating interlayer 240 may be formed on the second etch stop layer 235.

A second metal wiring 250 may be formed in the third insulating interlayer 240 to be electrically connected to the first metal wiring 230. A protection layer 255 may be formed on the second metal wiring 250 and the third insulating interlayer 240.

A subsidiary substrate 260 may be attached onto the protection layer 255.

Figure 17:
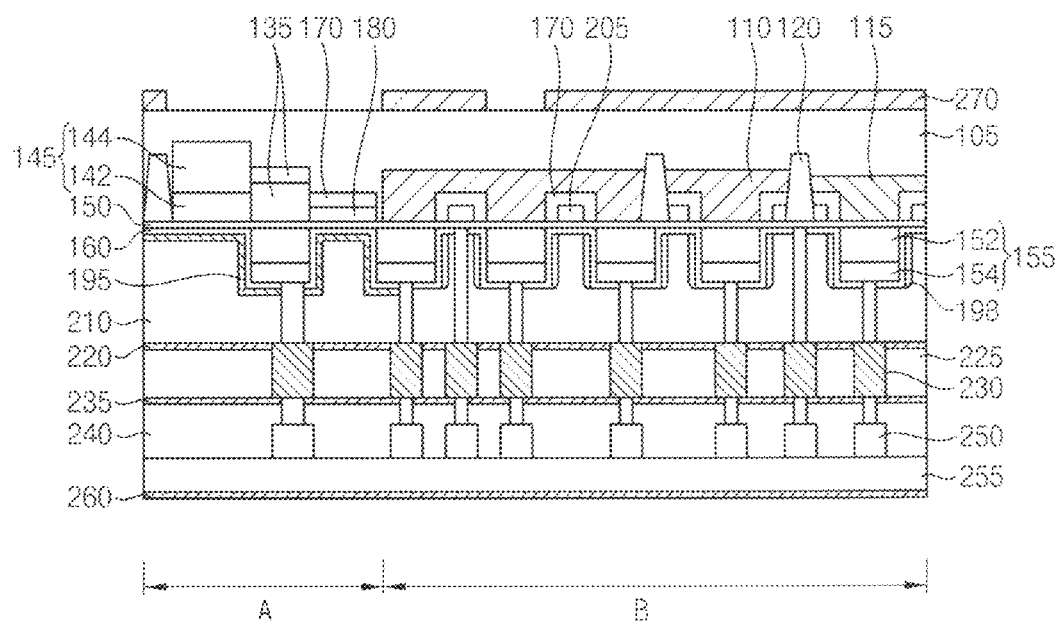

Referring to FIG. 17, after the subsidiary substrate 260 is attached onto the protection layer 255 on the first surface of the substrate 100, the resultant structure may be turned over for convenience of manufacturing. Portions of the second surface of the substrate 100 may be removed by a thinning process to expose the epitaxial layer 105.

A metal wiring layer (not illustrated) may be formed on the epitaxial layer 105 on the second surface of the substrate 100. The metal wiring layer may be formed on the region B while leaving the region A exposed. For example, the metal wiring layer may include a metal such as aluminum. Then, the metal wiring layer may be partially etched to form a light blocking layer 270 having at least one drainage path in a boundary region between the region A and the region B.

Figure 18:
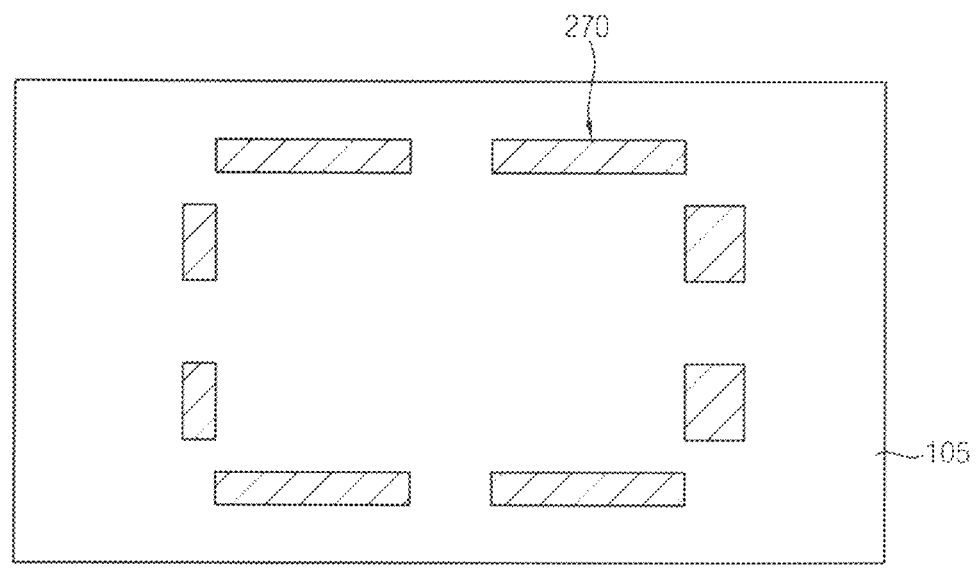

FIG. 18 illustrates a plan view of a light blocking layer formed by processes illustrated in FIGS. 6 to 17 in accordance with an embodiment.

Referring to FIG. 18, the light blocking layer 270 may be substantially identical to the light blocking 60 layer of FIG. 4. The light blocking layer 270 may include, e.g., four or eight, metal wiring patterns on the region B. The metal wiring patterns may be arranged to surround the region A. The metal wiring patterns may be spaced apart from one another to form the drainage path.

The drainage path may be formed at the corner portion and the middle portion of the metal wiring pattern. Additionally, the drainage path may be arranged freely without affecting signal processing. Further, the drainage path at the corner portion of the metal wiring pattern may have a structure configured to prevent the vortex of a coating solution for forming a color filter layer.

Figure 19:
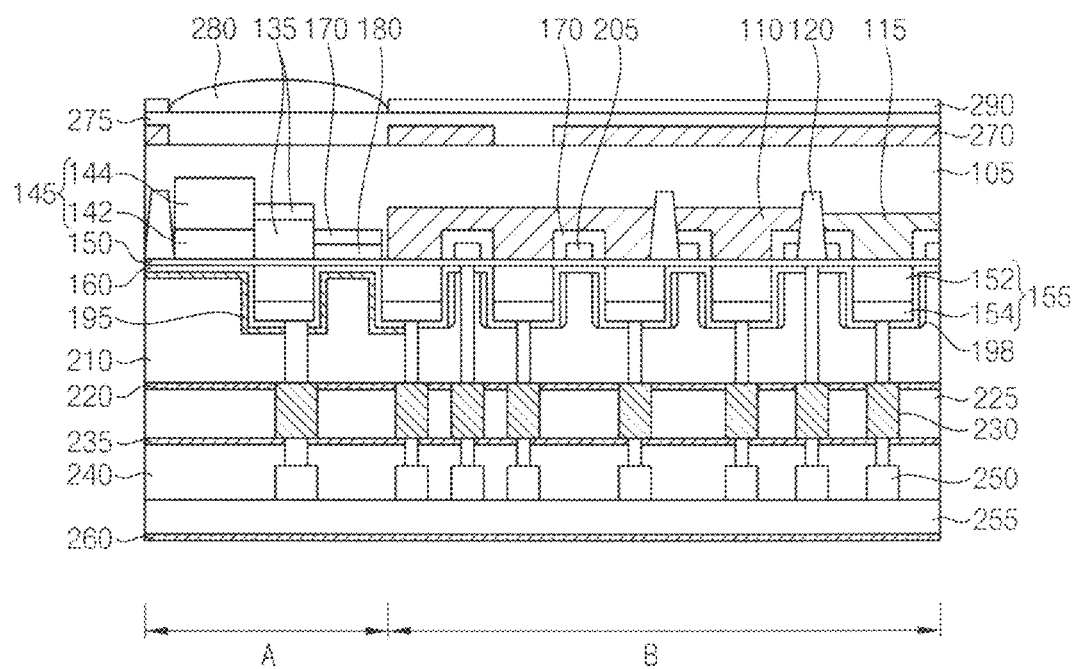

Referring to FIG. 19, a color filer layer 275 may be formed on the epitaxial layer 105 on the second surface of the substrate 100. The color filter layer 275 may cover the region A and the region B.

For example, a coating solution for a color filter layer may be coated on the second surface of the substrate 100. Then, a portion of the coating solution may be drained from the region A through the drainage path of the light blocking layer 270, thereby forming the color filter layer 275 having a uniform height along the boundary region between the region A and the region B. In other words, the color filter layer 275 may have a uniform, flat surface across the APS array region, the OPB region, and the boundary region therebetween.

After forming the color filter layer 275, a microlens 280 may be formed on the first region A; and a protection layer 290 may be formed to expose the microlens 280, thereby forming a CIS having a backside illumination (BSI) architecture.

Figure 20:
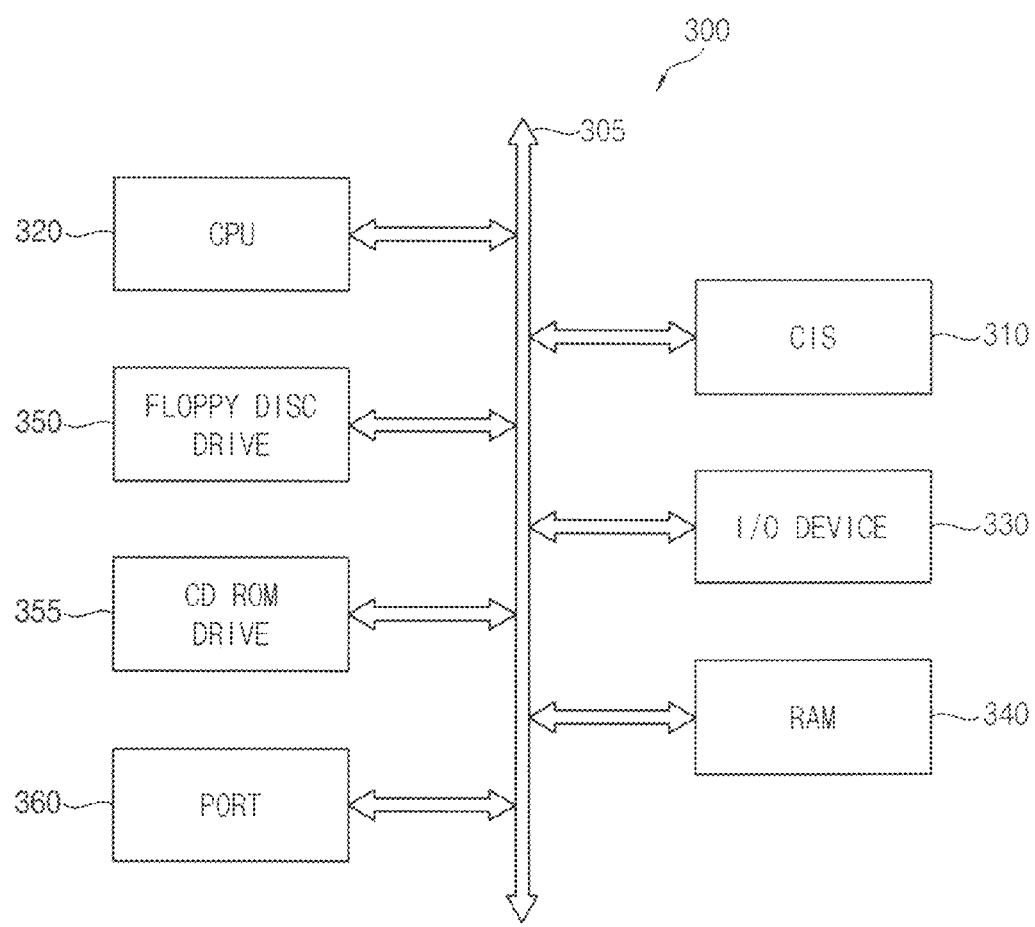
FIG. 20 illustrates a block diagram of a system having a CIS including a light blocking layer in accordance with an embodiment.

FIG. 20 illustrates a block diagram showing a system having a CIS including a light blocking layer in accordance with an embodiment.

Referring to FIG. 20, a system 300 may handle output images of a CIS 310. The system 300 may include, e.g., a computer system, a camera system, a scanner, an image security system, etc.

The system 300 may include a central processing unit (CPU) 320 that may communicate with an input/output (I/O) device 330 via a bus 305. The CPU 320 may be electrically connected to, e.g., a floppy disk drive 350, a CD-ROM drive 355, a port 360, and/or a random access memory (RAM) 340 through the bus 305. Data may be transferred to the CPU 320, the floppy disk drive 350, the CD-ROM drive 355, the port 360, and/or the random access memory (RAM) 340 through the bus 305. Thus, the CIS output image may be produced.

The port 360 may be coupled with, e.g., a video card, a sound card, a memory card, a USB device, or the like. The port 360 may communicate with other systems.

The CIS 310 may be mounted on, e.g., a chip (not shown) with the CPU 320, a digital signal processing (DSP) device or a memory device (not shown).

As mentioned above, a CIS having a backside illumination architecture may include an APS array region and a peripheral circuit region. A light blocking layer may be formed on the peripheral circuit region to expose the APS array region. The light blocking layer may have at least one drainage path along a boundary region between the APS array region and the peripheral circuit region.

Accordingly, when a coating solution is coated to form a color filter layer, a portion of the coating solution may be drained from the APS array region through the drainage path of the light blocking layer, thereby forming the color filter layer having a uniform height along the boundary region between the APS array region and the peripheral circuit region. Thus, blooming problems or blemish problems due to a thickness difference of the coated color filter layer between the APS array region and the peripheral circuit region may be prevented.

By way of review, in a comparative CIS, the color filter layer may have a step portion between the APS array region and the OBP region due to the light blocking layer. For example, the color filter layer may have a relatively low height on the APS array region from the backside of the substrate. Thus, a dummy cell may be further formed on the boundary region between the APS array region and the OBP region.

According to the embodiments, a thickness difference of the underlying layer structures on a boundary region of the APS array region and the OBP region may not occur, thereby preventing coating problems of the color filter layer as well as reducing resultant chip size and manufacturing costs.

The embodiments provide a complementary metal-oxide semiconductor (CMOS) image sensor (CIS) having improved characteristics.

According to the embodiments, when a coating solution is coated to form a color filter layer, a portion of the coating solution may be drained from the APS array region through the drainage path of the light blocking layer, thereby forming the color filter layer having a uniform height along the boundary region between the APS array region and the peripheral circuit region. Thus, undesirable blooming and/or blemishes due to a thickness difference of the coated color filter layer between the APS array region and the peripheral circuit region may be prevented.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a complementary metal-oxide semiconductor (CMOS) image sensor (CIS), the method comprising:
    preparing a substrate having a first surface and a second surface opposite to the first surface such that the substrate includes:
        an active pixel sensor (APS) array region including a photoelectric transformation element, and
        a peripheral circuit region;
    forming an insulating interlayer on the first surface of the substrate such that the insulating interlayer includes metal wirings electrically connected to the photoelectric transformation element;
    forming a light blocking layer on the peripheral circuit region of the second surface of the substrate such that the light blocking layer exposes the APS array region and includes a plurality of metal wiring patterns spaced apart from one another to form at least one drainage path along a boundary region between the APS array region and the peripheral circuit region;
    forming a color filter layer on the second surface of the substrate to cover the APS array region and the light blocking layer; and
    forming a microlens on the color filter layer on the APS array region.

2. The method as claimed in claim 1, wherein forming the light blocking layer includes:
    forming a metal wiring layer on the second surface of the substrate such that the metal wiring layer surrounds the APS array region; and
    partially removing the metal wiring layer to form the metal wiring patterns defining the at least one drainage path.

3. The method as claimed in claim 1, wherein forming the APS array region and the peripheral circuit region includes:
    forming an epitaxial layer in the first surface of the substrate;
    forming a photodiode, a transfer gate, and a floating diffusion layer on the epitaxial layer in a first region of the substrate; and
    forming a logic transistor in a second region of the substrate.

4. The method as claimed in claim 1, further comprising removing portions of the second surface of the substrate to expose the epitaxial layer.

5. The method as claimed in claim 1, wherein forming the color filter layer includes:
    coating a coating solution for a color filter layer on the second surface of the substrate; and draining a portion of the coating solution from the APS array region through the drainage path of the light blocking layer such that the color filter layer has a uniform height along the boundary region between the APS array region and the peripheral circuit region.

6. The method as claimed in claim 1, wherein forming the color filter layer includes:

coating a coating solution for a color filter layer on the second surface of the substrate; and draining a portion of the coating solution from the APS array region through the drainage path of the light blocking layer such that the color filter layer has a uniform, flat surface across the APS array region, the peripheral circuit region, and the boundary region therebetween.

7. The method as claimed in claim 2, wherein the drainage path is formed at a corner portion of the metal wiring layer.

8. The method as claimed in claim 2, wherein the drainage path is formed at a middle portion of the metal wiring layer.

9. The method as claimed in claim 2, wherein the metal wiring patterns form a plurality of drainage paths at a corner portion and a middle portion of the metal wiring layer.

10. The method as claimed in claim 2, wherein the metal wiring layer includes aluminum.

\* \* \* \* \*